United States Patent
Quaglietta et al.

(10) Patent No.: US 10,916,512 B2
(45) Date of Patent: Feb. 9, 2021

(54) CAPACITOR METAL GUARD RING FOR MOISTURE INGRESSION PREVENTION

(71) Applicant: SKYWORKS SOLUTIONS, INC., Woburn, MA (US)

(72) Inventors: Anthony Francis Quaglietta, Methuen, MA (US); Karen R. Freitas, Lowell, MA (US)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 29 days.

(21) Appl. No.: 16/225,302

(22) Filed: Dec. 19, 2018

(65) Prior Publication Data

US 2019/0189570 A1    Jun. 20, 2019

Related U.S. Application Data

(60) Provisional application No. 62/608,022, filed on Dec. 20, 2017.

(51) Int. Cl.
| | |
|---|---|
| H01L 29/00 | (2006.01) |
| H01L 23/00 | (2006.01) |
| H01L 23/31 | (2006.01) |
| H01L 23/66 | (2006.01) |
| H01L 49/02 | (2006.01) |
| H01L 23/552 | (2006.01) |

(52) U.S. Cl.
CPC ........ *H01L 23/564* (2013.01); *H01L 23/3121* (2013.01); *H01L 23/3142* (2013.01); *H01L 23/66* (2013.01); *H01L 28/40* (2013.01); *H01L 23/552* (2013.01); *H01L 2223/6677* (2013.01)

(58) Field of Classification Search
CPC ............... H01L 23/3121; H01L 23/552; H01L 23/3142; H01L 23/564
See application file for complete search history.

(56) References Cited

U.S. PATENT DOCUMENTS

| | | | |
|---|---|---|---|
| 2008/0251923 A1 | 10/2008 | Wang et al. | |
| 2010/0219454 A1* | 9/2010 | Amasuga | H01L 29/0649 257/256 |
| 2012/0025370 A1 | 2/2012 | Wholey et al. | |
| 2012/0181670 A1* | 7/2012 | Takemura | H01L 23/562 257/620 |
| 2014/0035107 A1* | 2/2014 | Yang | H01L 23/5225 257/620 |
| 2015/0200244 A1 | 7/2015 | Barth et al. | |
| 2016/0372427 A1 | 12/2016 | Altunkilic et al. | |

FOREIGN PATENT DOCUMENTS

KR    10-2002-0055177 A    7/2002

OTHER PUBLICATIONS

International Search Report and Written Opinion from corresponding International Application No. PCT/US2018/066493 dated Apr. 16, 2019.

* cited by examiner

*Primary Examiner* — Samuel A Gebremariam
(74) *Attorney, Agent, or Firm* — Lando & Anastasi, LLP

(57) ABSTRACT

A semiconductor die includes at least one electronic component, an at least partially moisture permeable material disposed on or about the at least one electronic component, at least one opening defining at least one path for moisture to migrate from an environment external to the die into the at least partially moisture permeable material, and a moisture impermeable shield disposed between the at least one electronic component and the at least one opening.

20 Claims, 10 Drawing Sheets

CAPACITOR METAL GUARD RING FOR MOISTURE INGRESSION PREVENTION

CROSS-REFERENCE TO RELATED APPLICATIONS

This application claims priority under 35 U.S.C. § 119(e) to U.S. Provisional Patent Application Ser. No. 62/608,022 titled "CAPACITOR GUARD RING FOR MOISTURE INGRESSION PREVENTION", filed Dec. 20, 2017, which is incorporated herein in its entirety for all purposes.

BACKGROUND

Semiconductor devices, for example, monolithic microwave integrated circuits (MMICs), sometimes suffer from moisture ingression issues that can result in failed circuitry during operation. Moisture may enter an integrated circuit die through either sides of the die or through a final coating layer applied to the die.

SUMMARY

In accordance with one aspect, there is provided a semiconductor die. The semiconductor die comprises at least one electronic component, an at least partially moisture permeable material disposed on or about the at least one electronic component, at least one opening defining at least one path for moisture to migrate from an environment external to the die into the at least partially moisture permeable material, and a moisture impermeable shield disposed between the at least one electronic component and the at least one opening.

In some embodiments, the at least one electronic component includes a capacitor.

In some embodiments, the moisture impermeable shield comprises a metal wall. The metal wall may include portions of one or more same metal layers as the at least one electronic component. The metal wall may include portions of a metal layer closest to a substrate of the die among all metal layers in the die. The metal wall may be grounded. The metal wall may be electrically coupled to a through-substrate via passing through a substrate of the die from a side of the die on which the metal wall is disposed to an opposite side of the die, the through-substrate via being electrically coupled to a ground terminal disposed on the opposite side of the die.

In some embodiments, the at least partially moisture permeable material includes one of polyimide and poly-p-phenylenebenzobisoxazole.

In some embodiments, the semiconductor die further includes a die seal ring disposed about a periphery of the die, the at least one opening including a break in the die seal ring.

In some embodiments, the semiconductor die further includes a second moisture impermeable shield, the second moisture impermeable shield comprising a portion of a metal layer disposed between the at least one electronic component and the at least one opening. The second moisture impermeable shield may be electrically floating.

In some embodiments, the semiconductor die further includes a second moisture impenetrable barrier disposed between the at least partially moisture permeable material and a moisture sensitive area of the at least one electronic component. The at least one electronic component may comprise a capacitor including two metal plates and a dielectric layer separating the two metal plates, and the second moisture impenetrable barrier includes a metal layer disposed between the at least partially moisture permeable material and the dielectric layer. The second moisture impenetrable barrier may further include a layer of substantially moisture impenetrable dielectric disposed between the at least partially moisture permeable material and the dielectric layer. The substantially moisture impenetrable dielectric may comprise silicon nitride.

In some embodiments, the semiconductor die is included in a radio frequency circuit module.

In some embodiments, the semiconductor die is included in a radio frequency device.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. In the figures, each identical or nearly identical component that is illustrated in various figures is represented by a like numeral. For purposes of clarity, not every component may be labeled in every figure. In the figures.

DETAILED DESCRIPTION

It has been discovered that voltage potentials across components in a semiconductor die tends to attract moisture into the die. As the term is used herein, "moisture" includes, but is not necessarily limited to, water. The moisture may cause reliability problems and may cause various components of the die to fail, for example, by causing a short circuit. Components at risk of failure due to moisture ingression include, for example, capacitors near edges of the die and capacitors across which a high voltage potential is applied during use. One solution that may decrease the likelihood of moisture ingression into a semiconductor die is to form a metal wall that functions as a die seal about the periphery of the die. The metal wall forms a hermetic seal that prevents moisture from entering through the sides of the die. Further, the die seal may be grounded to provide electromagnetic shielding of voltage potentials across components within the die and reduce the attraction of moisture into the die. In semiconductor die including components operating at radio frequencies ("RF components"), however, a continuous metal die seal about the periphery of the die may impact the performance of the die. The RF components of the die may electromagnetically couple to the continuous metal die seal and induce current in the die seal which may negatively impact the performance of the RF components by, for example, providing undesirable feedback or interfering electromagnetic signals. Further, to reduce the degradation in performance of RF components due to coupling with the die seal, the die seal may be left electrically floating. In semiconductor die including RF components, the die seal may be broken at various locations to lessen the likelihood of current generation in the die seal and reduce the impact on RF component performance that may otherwise be caused by the die seal. The provision of the breaks in the die seal, however, provides paths through which moisture may enter the die.

Figure 1A:
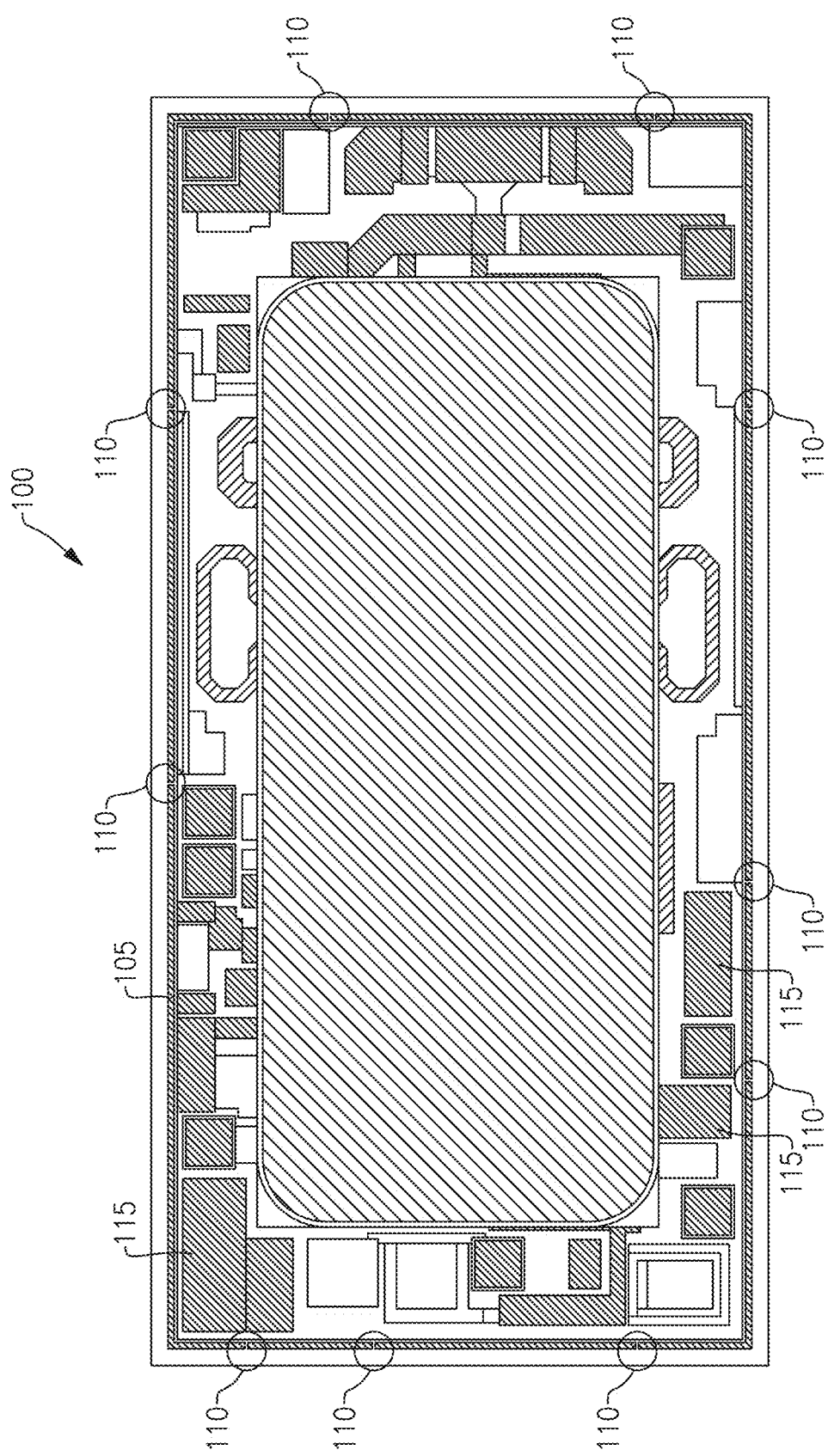
FIG. 1A is a plan view of an example of an integrated circuit die.
Figure 1B:
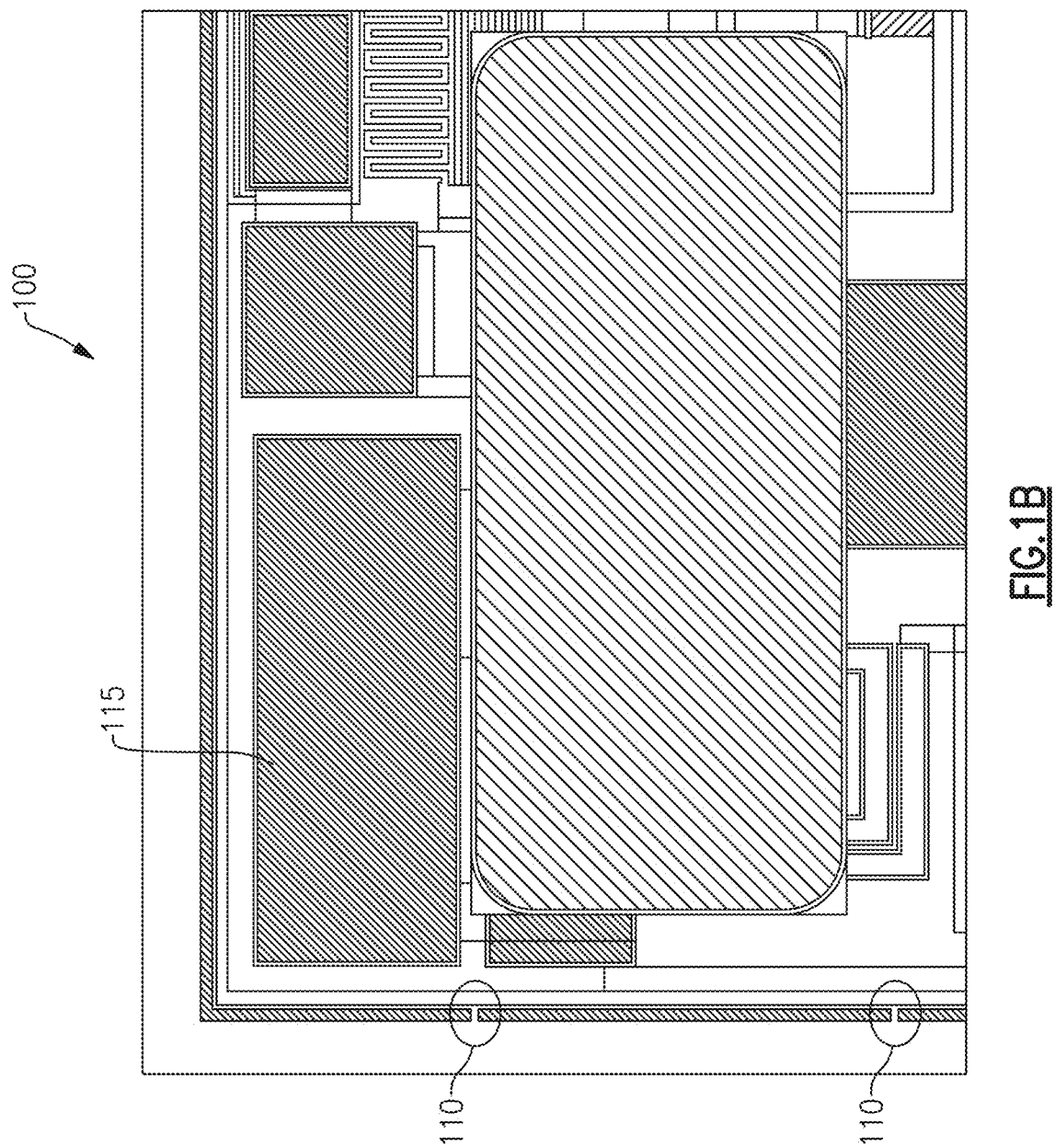
FIG. 1B is an enlargement of a portion of the integrated circuit die shown in FIG. 1A.

FIG. 1A illustrates an example of a die 100 including RF components and a metal die seal 105. Locations of breaks in the die seal 105 are illustrated with indicator numerals 110. Components of die 100 that may be at risk of damage due to ingress of moisture through the breaks 110 in the die seal 105 include large value bypass capacitors 115 that are proximate one of the breaks 110 in the dies seal 105. FIG. 1B is a close up of a portion of die 100. As can be seen, capacitor 115 is located in close proximity to one of the breaks 110 in the die seal 105 and thus may be susceptible to damage from moisture ingression through the break 110 in the die seal 105. Portions of the circuitry in FIGS. 1A and 1B not necessary for understanding of the disclosed embodiments are hidden.

Figure 2:
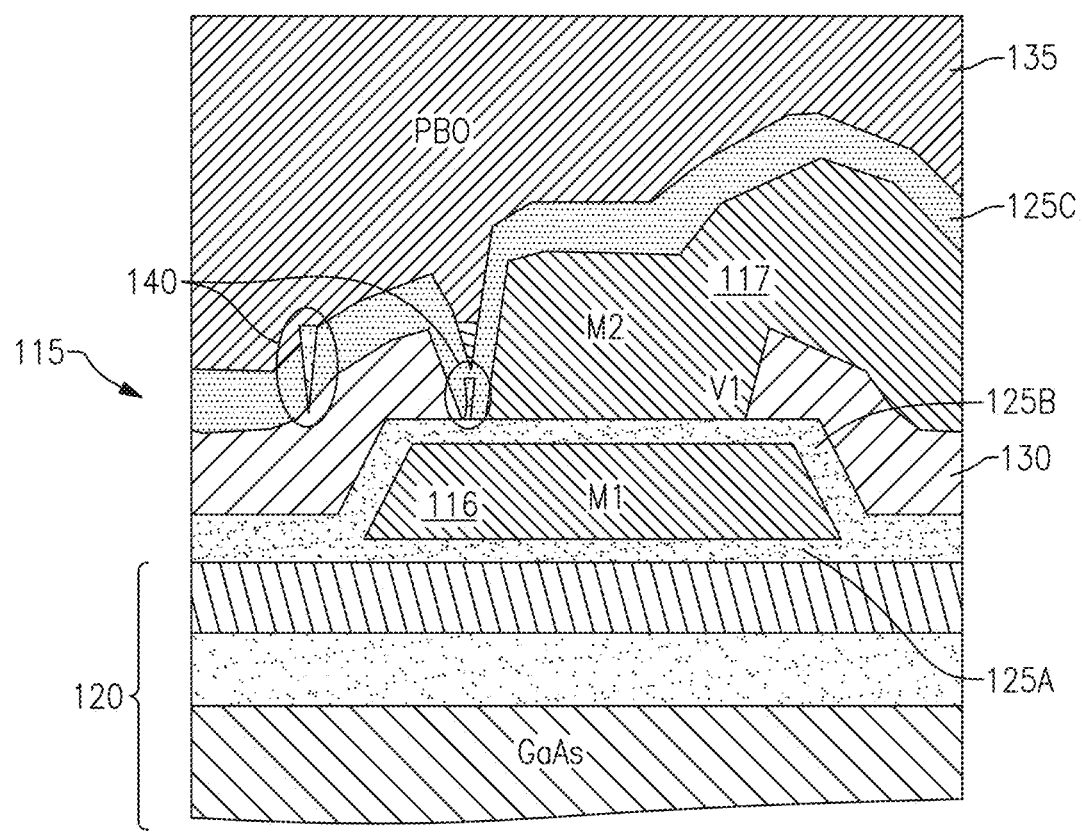
FIG. 2 is a cross-sectional view of a capacitor structure that may be included in an integrated circuit die.

Die including RF components ("RF die") may be formed on a gallium arsenide (GaAs) substrate 120 and may include metal layers, commonly referred to by the acronyms "M1," "M2," "M3," etc., with the M1 layer being closest to the substrate, and with M2 formed over M1, M3 formed over M2, etc. Via layers, commonly referred to by the acronyms "V1," "V2," "V3," etc., provide electrical connection between a metal layer sharing the same number in its acronym and a higher metal layer. The metal and via layers may be formed of, for example, copper, aluminum, polysilicon, or other known materials suitable for electrical interconnects known in the art. Dielectric material, for example, silicon nitride (SiN) 125, polyimide 130, and poly-p-phenylenebenzobisoxazole (PBO) 135 may be utilized to electrically separate metal layers and protect components of the die as illustrated in FIG. 2. Polyimide and PBO are permeable to moisture.

A capacitor utilized in an RF die (or a non-RF die) may be formed from two layers of metal separated by a layer of an insulting dielectric. Such capacitors may be referred to as metal-insulator-metal (MIM) capacitors. A proposed mechanism for the failure of a component such as a capacitor in a semiconductor die due to moisture ingression into the die is illustrated in FIG. 2. As illustrated in FIG. 2, a MIM capacitor 115 is formed on a GaAs substrate 120. The capacitor 115 includes a lower plate 116 formed from a portion of the M1 metal layer and an upper plate 117 formed by a combination of a portion of the M2 metal layer and a V1 via. The lower plate 116 is separated from the GaAs substrate 120 by a lower layer of SiN 125A and from the upper plate 117 by an upper layer of SiN 125B (also referred to as a "Cap SiN" layer) and a layer of polyimide 130. A topcoat layer of SiN 125C separates the upper plate 117 and the polyimide layer 130 from an encapsulating PBO layer 135.

Moisture that may have entered a die including the capacitor 115 may travel through the PBO layer 135 into the vicinity of the capacitor 115. The moisture may be attracted to the capacitor 115 by a bias applied across the plates 116, 117 of the capacitor 115. The topcoat layer of SiN 125C may have a low moisture transmittivity (a water vapor transmission rate on the order of $10^{-4}$ g/m²·day) and, in the absence of defects, may effectively prevent ingression of moisture into the capacitor structure. Defects such as cracks 140 in the topcoat layer of SiN 125C may provide for moisture to pass through the topcoat layer of SiN 125C and/or the layer of polyimide 130 and reach the Cap SiN layer 125B.

Figure 3A:
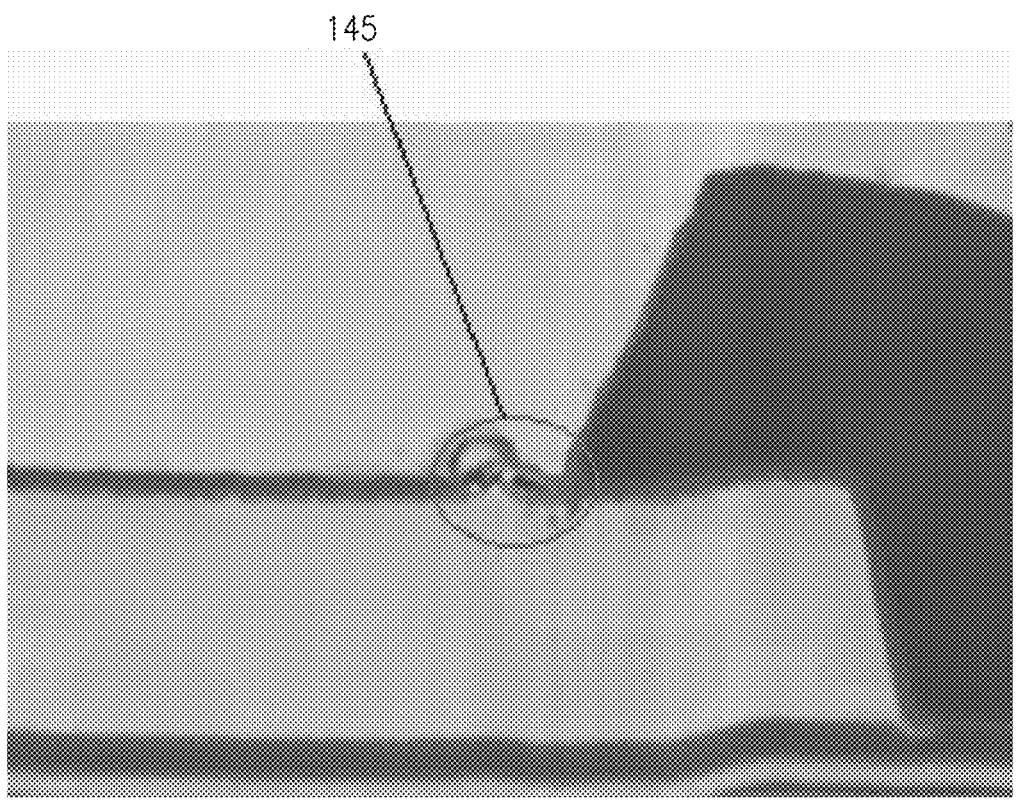
FIG. 3A illustrates damage to a capacitor of an integrated circuit die caused by moisture ingression into the die.
Figure 3B:
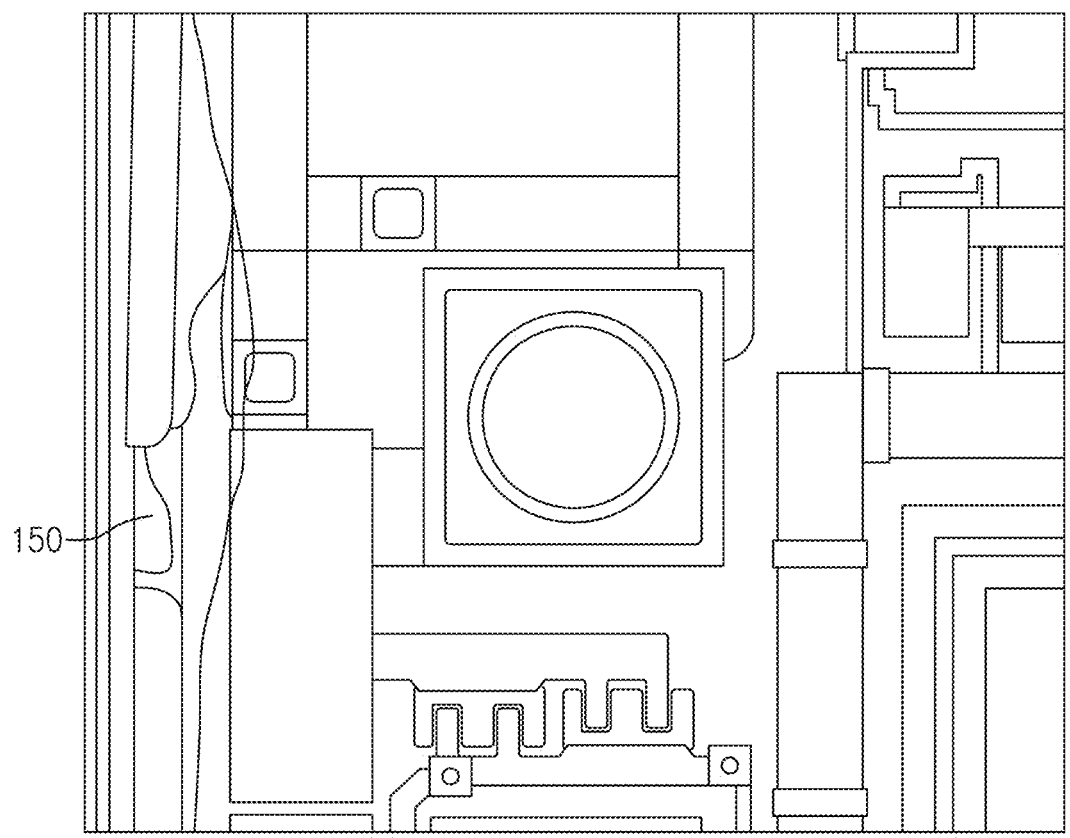
FIG. 3B illustrates damage to a conductive trace of an integrated circuit die caused by moisture ingression into the die.
Figure 3C:
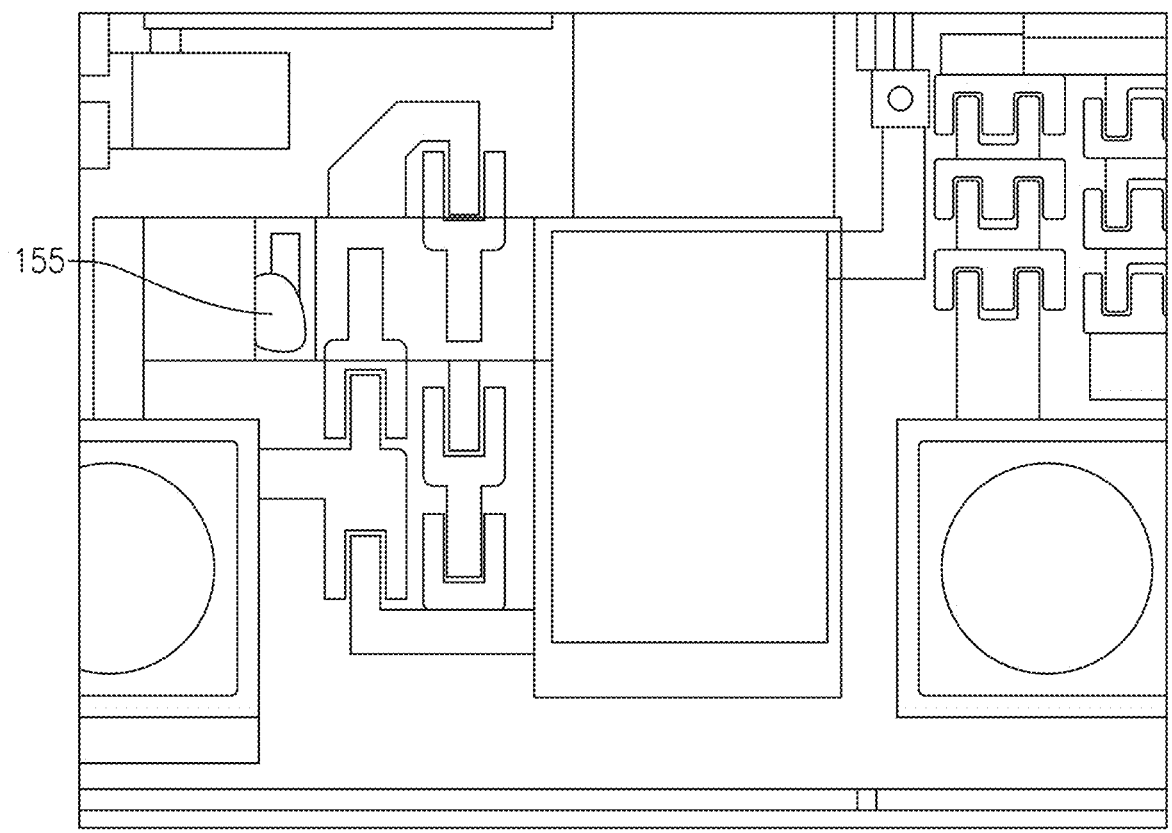
FIG. 3C illustrates damage to a resistor of an integrated circuit die caused by moisture ingression into the die.

The presence of moisture at or in the Cap SiN layer may cause damage to the capacitor 115. Without being bound to a particular theory, it is believed that voltage applied across the plates 116, 117 of the capacitor 115 may lead to ionization of water at or in the Cap SiN layer 125B, producing hydrogen ($H^+$) and hydroxide ($OH^-$) ions. The presence of these ions aid in electron hopping, progressive evolution of a conductive path through the Cap SiN layer 125B, and eventual breakdown. The breakdown of the Cap SiN layer 125B may result in a short circuit across the plates 116, 117 of the capacitor 115 which may permanently damage the capacitor 115 by causing metal bridging 145 between the plates 116, 117, an example of which is illustrated in the cross section of FIG. 3A. The short circuit across the plates 116, 117 of the capacitor 115 may also cause current surges in conductive paths leading to one or more of the plates 116, 117 of the capacitor 115, for example, in metal traces, vias, or resistors in electrical communication with one or more of the plates 116, 117 of the capacitor 115. These current surges may cause damage such as voids or breaks in the metal traces 150, vias, or resistors 155, for example, as illustrated in FIGS. 3B and 3C.

Figure 3D:
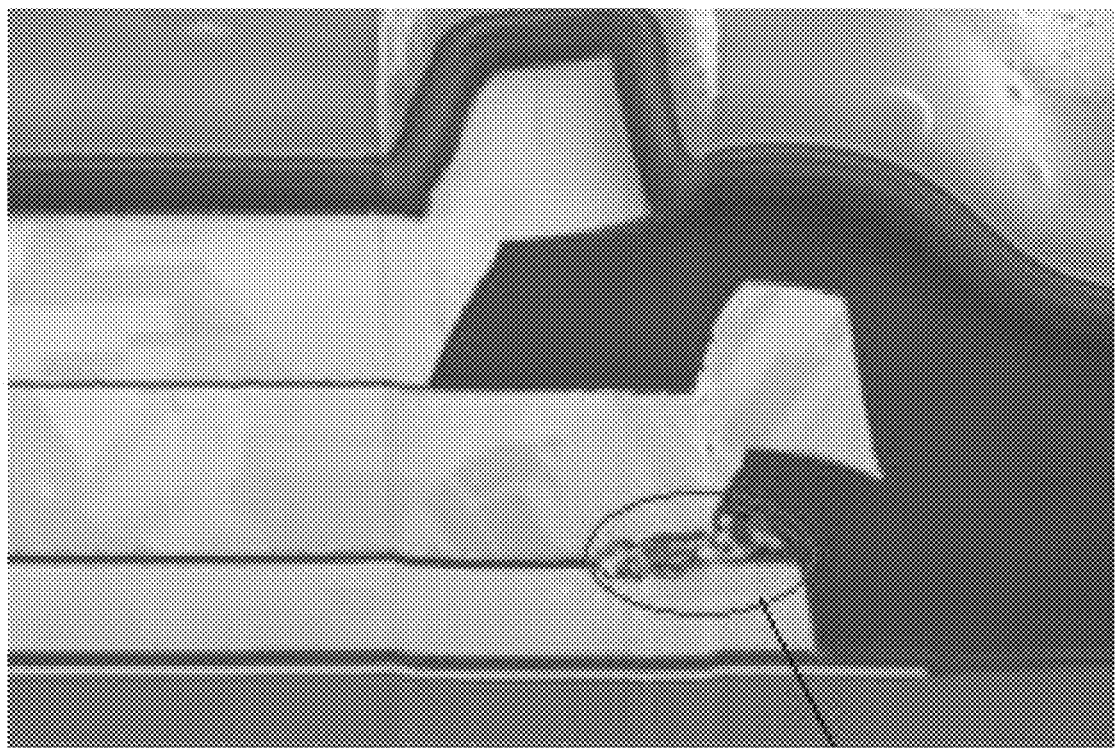
FIG. 3D illustrates damage to a capacitor of an integrated circuit die caused by moisture ingression into the die.

Other capacitors that may be utilized in RF die may include a first layer of metal, a first dielectric layer disposed on the first layer of metal, a second layer of metal disposed on the first dielectric layer, a second dielectric layer disposed on the second layer of metal, and a third layer of metal disposed on the second dielectric layer. In such triple metal layer capacitors, the middle metal layer, forming a first plate of the capacitor, may be grounded and charges may be provided on the upper and lower metal layers that together form the second plate of the capacitor. A similar failure mechanism as described with reference to FIG. 2 for a MIM capacitor may also occur in a triple metal layer capacitors due to water ingression into the die, which may cause one or more pairs of plates of a triple metal layer capacitor to short circuit and cause metal bridging 145 between plates of the capacitor, for example as illustrated in FIG. 3D.

A method to prevent or at least retard the ingress of moisture into components of an RF die and associated component failures may include providing one or more moisture impermeable barriers between moisture sensitive components of an RF die (or moisture sensitive regions of such components) and materials, for example, PBO and/or polyimide, through which moisture may travel in the die. Moisture impermeable barriers may additionally be provided proximate possible locations of moisture ingress into the die to halt or at least slow the transport of moisture into the die.

Figure 4:
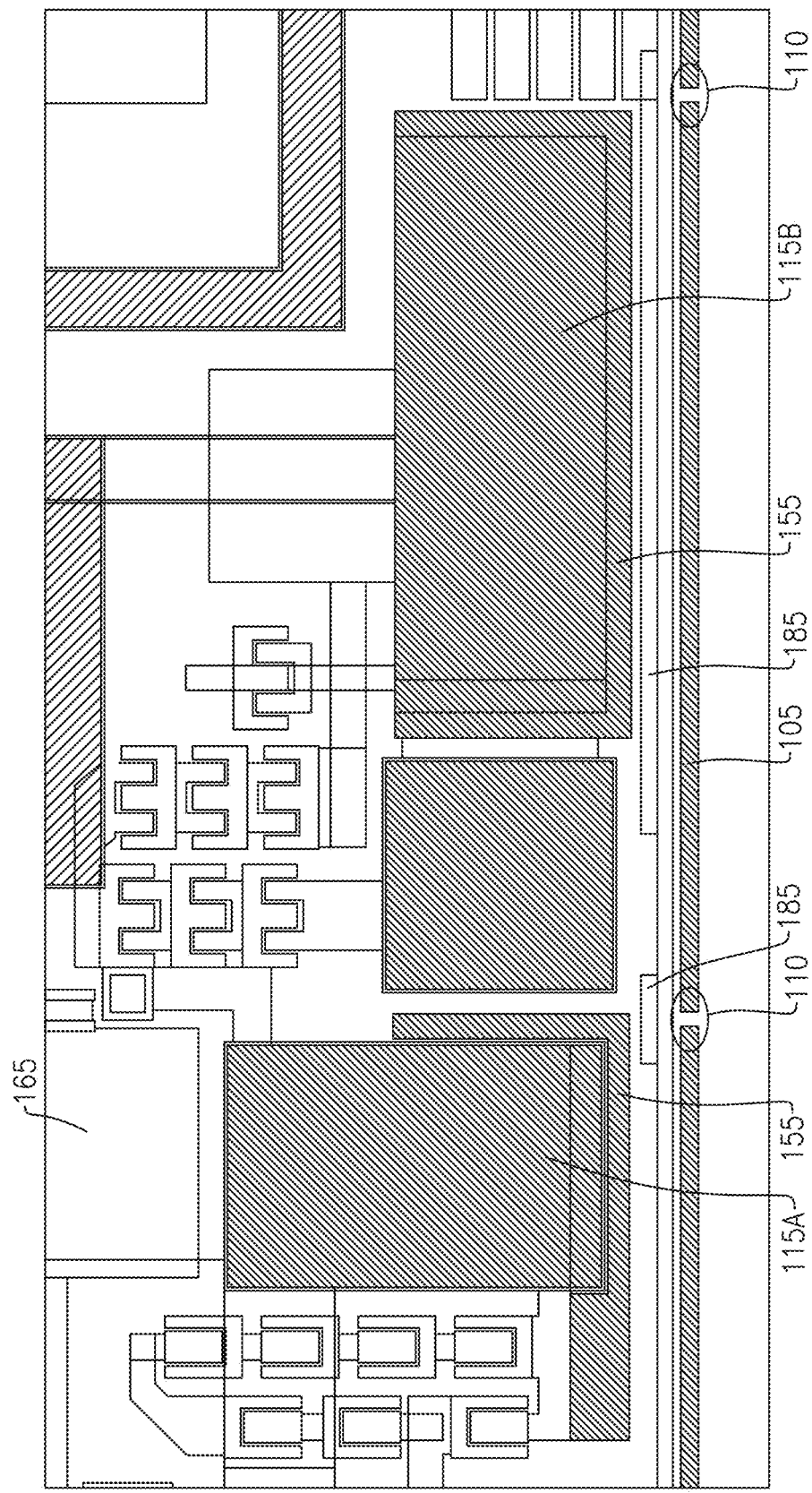
FIG. 4 is a plan view of an example of an integrated circuit die including moisture barrier structures.

One example of a moisture impermeable barrier is illustrated in FIG. 4. FIG. 4 illustrates a first L-shaped barrier 155 proximate to and extending across a bottom side and a portion of a right side of a first capacitor 115A and a second, U-shaped barrier 155 proximate to and extending across left, right, and bottom sides of a second capacitor 115B. The barriers 115 are disposed between the capacitors 115A, 115B and respective breaks 110 in the die seal 105 closest to the respective capacitors 115A, 115B. The barriers 115 may include stacked and electrically coupled portions of the M1, V1, and M2 metal layers of the die (designated 170, 175, and 180, respectively, in FIG. 5), or other metal layers from which the capacitors 115A, 115B may be formed, for example, the M1, V1, M2, V2, and M3 metal layers in the example of a triple metal layer capacitor. The metal material of the M1, V1, and M2 metal layers are impermeable to the passage of moisture. In other embodiments, the barriers 155 may include portions of additional metal layers above and/or below metal layers used to form the capacitors 115A, 115B. Barriers 155 may be electrically coupled to ground. Barriers 155 may thus both provide a physical barrier to moisture traveling through the die toward the capacitors 115A, 115B and electrically shield breaks 110 in the die seal 105 closest to the respective capacitors 115A, 115B from electric fields that may be generated by bias voltages applied across plates of the capacitors 115A, 115B that might otherwise draw moisture toward the capacitors 115A, 115B.

Figure 5:
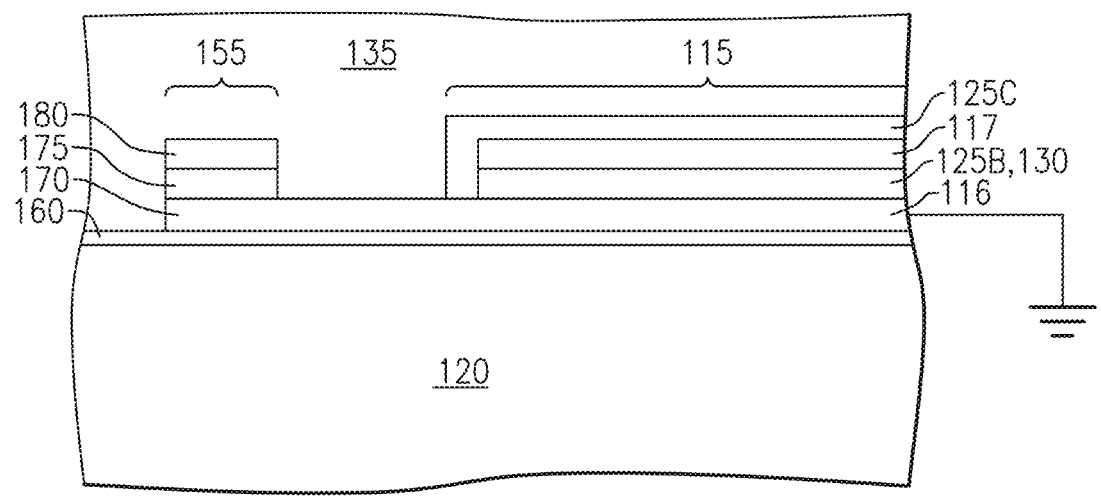
FIG. 5 is a cross-sectional view of a portion of the integrated circuit die of FIG. 4.

As illustrated in cross-section in FIG. 5, a barrier 155 may extend down to the substrate 120 of the die 100, optionally physically and electrically separated from the substrate 120 by a dielectric barrier layer 160, for example, a SiN layer, which may be contiguous with SiN layer 125A of FIG. 2. The dielectric barrier layer 160 may help prevent metal from the barrier 155 from diffusing into the substrate 120 and possible causing electrical faults. In other embodiments, different barrier layer materials may be provided between the barrier 155 and the substrate 120, for example, a titanium/titanium nitride metal stack. In further embodiments, the barrier 155 may directly contact the substrate 120.

One of the metal layers, for example, the M1 layer 170 of a barrier 155 may be electrically coupled to and/or formed contiguous with a plate, for example, bottom plate 116 of a capacitor 115, or the middle plate, in the example of a triple metal layer capacitor. The M1 layer 170 or 116 may be grounded, for example, by being electrically coupled to a via 165 (FIG. 4) passing through the substrate of the die to a ground connection on the rear of the die. In other embodiments, each of the layers of the barrier are non-contiguous with plates of the capacitor 115 and the barrier 155 may be grounded by a ground connection separate from a ground connection for a plate of the capacitor 115. In FIG. 5, the layers of the capacitor 115 are provided with indicators corresponding to those in FIG. 2.

FIG. 4 also illustrates a second form of moisture barrier. The second form of moisture barrier is indicated at 185. Moisture barrier 185 includes portions of metal layer M1 internal to the die between the capacitors 115A and 115B and corresponding breaks 110 in the die seal 105 closest to the respective capacitors 115A, 115B. Moisture barrier 185 may include ungrounded, floating portions of metal layer M1. In other embodiments, moisture barrier 185 is grounded. In further embodiments, moisture barrier 185 may include portions of metal layer M2 in addition to or instead of portions of metal layer M1. The portions of metal layer M1 and/or M2 are impermeable to moisture and thus, moisture barrier 185 provides a physical barrier to moisture between the breaks 110 in the die seal 105 and the capacitors 115A, 115B. Moisture barrier(s) 185 may also at least partially electrically shield the breaks 110 in the die seal 105 from electric fields generated by bias applied across the plates of capacitors 115A or 115B and reduce the attraction of moisture toward the capacitors 115A or 115B. Moisture barrier(s) 185 may be utilized in conjunction with barriers 155 to prevent, or at least retard the transport of moisture through the breaks 110 in the die seal 105 toward the capacitors 115A, 115B.

Barriers 155 and 185 may be added to a semiconductor die such as that illustrated in FIG. 1A without adding to the area of the die. In some die fabrication processes metal layers are deposited and desired metal patterns are defined by deposition and patterning of photoresist on the metal layers. Unwanted portions of the metal layers may be removed by a metal lift off process in which the patterned photoresist is removed, for example, with a solvent or by ashing and portions of metal on top of the photoresist are removed along with the photoresist. In some processes, non-functional portions of one or more metal layers are left in place on the die in some areas to reduce the need to pattern these areas and thus increase the efficiency of the fabrication process or to prevent separation of various layers by providing a sufficient surface area to avoid separation from an upper layer. In various embodiments, barriers 155 and/or 185 may be formed in areas of the die in which residual non-functional portions of one or more metal layer would otherwise have been left in place or in areas of the die that would otherwise have been free of functional structures. The barriers 155 and/or 185 may thus not require any additional space to be added to a die to accommodate the barriers 155 and/or 185.

Although described with reference to RF die including GaAs substrates, it is to be appreciated that similar moisture barrier structures as described herein may be implemented in non-RF die or die having substrates other than GaAs, for example, die including silicon substrates.

Figure 6:
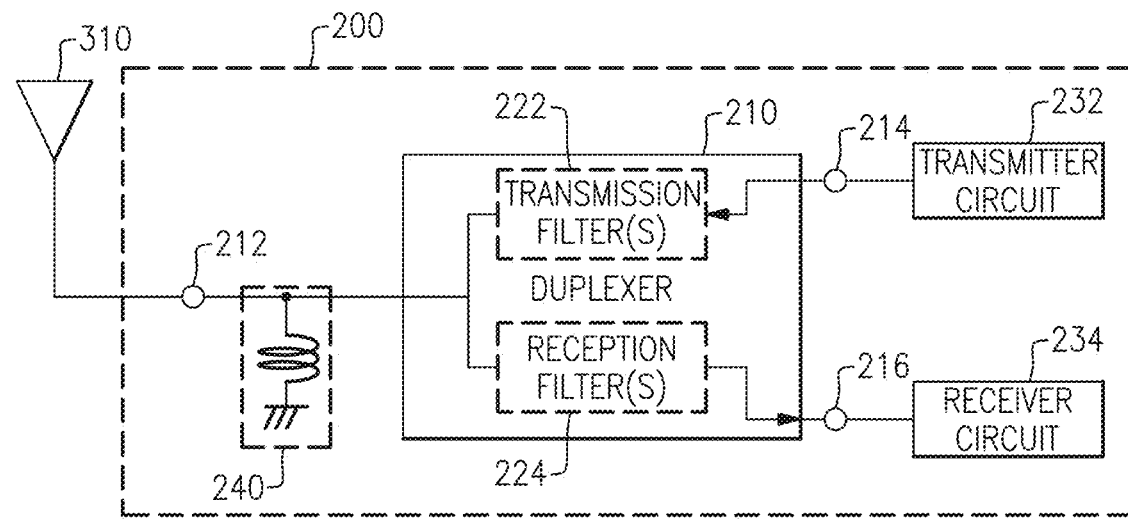
FIG. 6 is a block diagram of an example of a module which may be used in an electronic device.

Aspects and embodiments of the moisture barriers disclosed herein may be provided in die that may be utilized in modules of an RF device. Referring to FIG. 6, there is illustrated a block diagram of one example of a front-end module 200, which may be used in an electronic device such as a wireless communications device (e.g., a mobile phone) for example. The front-end module 200 includes an antenna duplexer 210 having a common node 212, an input node 214, and an output node 216. An antenna 310 is connected to the common node 212. The front-end module 200 further includes a transmitter circuit 232 connected to the input node 214 of the duplexer 210 and a receiver circuit 234 connected to the output node 216 of the duplexer 210. The transmitter circuit 232 can generate signals for transmission via the antenna 310, and the receiver circuit 234 can receive and process signals received via the antenna 310. In some embodiments, the receiver and transmitter circuits are implemented as separate components, as shown in FIG. 6; however in other embodiments these components may be integrated into a common transceiver circuit or module. As will be appreciated by those skilled in the art, the front-end module 200 may include other components that are not illustrated in FIG. 6 including, but not limited to, switches, electromagnetic couplers, amplifiers, processors, and the like.

The antenna duplexer 210 may include one or more transmission filters 222 connected between the input node 214 and the common node 212, and one or more reception filters 224 connected between the common node 212 and the output node 216. The passband(s) of the transmission filter(s) are different from the passband(s) of the reception filters. Each of the transmission filter(s) 222 and the reception filter(s) 224 may include an embodiment of an acoustic wave device as disclosed herein. An inductor or other matching component 240 may be connected at the common node 212.

In certain examples, the acoustic wave elements used in the transmission filter 222 or the reception filter 224 are disposed on a single piezoelectric substrate. This structure reduces the effect of changes in temperature upon the frequency responses of the respective filter, in particular, reducing degradation in the passing or attenuation characteristics due to changes in the temperature, because each acoustic wave element changes similarly in response to changes in the ambient temperature. In addition, this arrangement may also allow the transmission filter 222 or reception filter 224 to have a small size.

Figure 7:
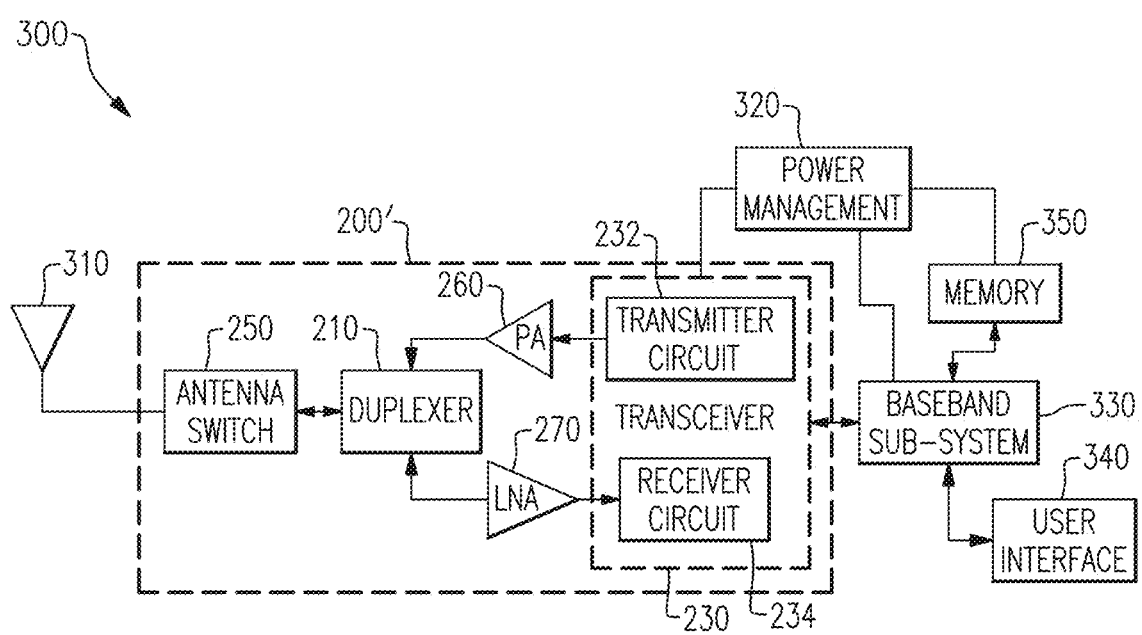
FIG. 7 is a block diagram of an embodiment of a wireless device.

FIG. 7 is a block diagram of one example of a wireless device 300 including the antenna duplexer 210 shown in FIG. 6. The wireless device 300 can be a cellular phone, smart phone, tablet, modem, communication network or any other portable or non-portable device configured for voice or data communication. The wireless device 300 can receive and transmit signals from the antenna 310. The wireless device includes an embodiment of a front-end module 200' similar to that discussed above with reference to FIG. 6. The front-end module 200' includes the duplexer 210, as discussed above. In the example shown in FIG. 7 the front-end module 200' further includes an antenna switch 250, which can be configured to switch between different frequency bands or modes, such as transmit and receive modes, for example. In the example illustrated in FIG. 7, the antenna switch 250 is positioned between the duplexer 210 and the antenna 310; however, in other examples the duplexer 210 can be positioned between the antenna switch 250 and the antenna 310. In other examples the antenna switch 250 and the duplexer 210 can be integrated into a single component.

The front end module 200' includes a transceiver 230 that is configured to generate signals for transmission or to process received signals. The transceiver 230 can include the transmitter circuit 232, which can be connected to the input node 214 of the duplexer 210, and the receiver circuit 234, which can be connected to the output node 216 of the duplexer 210, as shown in the example of FIG. 6.

Signals generated for transmission by the transmitter circuit 232 are received by a power amplifier (PA) module 260, which amplifies the generated signals from the transceiver 230. The power amplifier module 260 can include one or more power amplifiers that may be formed on a GaAs substrate and that may include components and moisture barriers as discussed above. The power amplifier module 260 can be used to amplify a wide variety of RF or other frequency-band transmission signals. For example, the power amplifier module 260 can receive an enable signal that can be used to pulse the output of the power amplifier to aid in transmitting a wireless local area network (WLAN) signal or any other suitable pulsed signal. The power amplifier module 260 can be configured to amplify any of a variety of types of signal, including, for example, a Global System for Mobile (GSM) signal, a code division multiple access (CDMA) signal, a W-CDMA signal, a Long Term Evolution (LTE) signal, or an EDGE signal. In certain embodiments, the power amplifier module 260 and associated components including switches and the like can be fabricated on gallium arsenide (GaAs) substrates using, for example, high-electron mobility transistors (pHEMT) or insulated-gate bipolar transistors (BiFET), or on a silicon substrate using complementary metal-oxide semiconductor (CMOS) field effect transistors.

Still referring to FIG. 7, the front-end module 200' may further include a low noise amplifier module 270, which amplifies received signals from the antenna 310 and provides the amplified signals to the receiver circuit 234 of the transceiver 230.

The wireless device 300 of FIG. 7 further includes a power management sub-system 320 that is connected to the transceiver 230 and manages the power for the operation of the wireless device 300. The power management system 320 can also control the operation of a baseband sub-system 330 and various other components of the wireless device 300. The power management system 320 can include, or can be connected to, a battery (not shown) that supplies power for the various components of the wireless device 300. The power management system 320 can further include one or more processors or controllers that can control the transmission of signals, for example. In one embodiment, the baseband sub-system 330 is connected to a user interface 340 to facilitate various input and output of voice and/or data provided to and received from the user. The baseband sub-system 330 can also be connected to memory 350 that is configured to store data and/or instructions to facilitate the operation of the wireless device, and/or to provide storage of information for the user.

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the invention. It is to be appreciated that embodiments of the methods and apparatuses discussed herein are not limited in application to the details of construction and the arrangement of components set forth in the foregoing description or illustrated in the accompanying drawings. The methods and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Any references to front and back, left and right, top and bottom, upper and lower, and vertical and horizontal are intended for convenience of description, not to limit the present systems and methods or their components to any one positional or spatial orientation. Accordingly, the foregoing description and drawings are by way of example only.

What is claimed is:

1. A semiconductor die comprising:
   at least one electronic component;
   an at least partially moisture permeable material disposed on or about the at least one electronic component;
   a die seal ring disposed about a periphery of the die, the die seal ring including a plurality of breaks separated from one another about the die seal ring and defining at least one path for moisture to migrate from an environment external to the die into the at least partially moisture permeable material; and
   a moisture impermeable shield disposed between the at least one electronic component and the at least one path.

2. The semiconductor die of claim 1 wherein the at least one electronic component includes a capacitor.

3. The semiconductor die of claim 2 further comprising a topcoat layer covering at least a portion of a cap layer disposed on plate of the capacitor, a crack being defined in the topcoat layer, the crack providing a second path for the moisture to migrate to the cap layer.

4. The semiconductor die of claim 1 wherein the moisture impermeable shield comprises a metal wall.

5. The semiconductor die of claim 4 wherein the metal wall includes portions of one or more same metal layers as the at least one electronic component.

6. The semiconductor die of claim 4 wherein the metal wall includes portions of a metal layer closest to a substrate of the die among all metal layers in the die.

7. The semiconductor die of claim 6 further comprising a diffusion barrier layer disposed on the substrate, the metal wall being disposed on the diffusion barrier layer.

8. The semiconductor die of claim 4 wherein the metal wall is grounded.

9. The semiconductor die of claim 8 wherein the metal wall is electrically coupled to a through-substrate via passing through a substrate of the die from a side of the die on which the metal wall is disposed to an opposite side of the die, the through-substrate via being electrically coupled to a ground terminal disposed on the opposite side of the die.

10. The semiconductor die of claim 1 wherein the at least partially moisture permeable material includes one of polyimide and poly-p-phenylenebenzobisoxazole.

11. The semiconductor die of claim 1 further including a second moisture impermeable shield, the second moisture impermeable shield comprising a portion of a metal layer disposed between the at least one electronic component and the at least one opening.

12. The semiconductor die of claim 11 wherein the second moisture impermeable shield is electrically floating.

13. The semiconductor die of claim 1 further including a second moisture impenetrable shield disposed between the at least partially moisture permeable material and a moisture sensitive area of the at least one electronic component.

14. The semiconductor die of claim 13 wherein the at least one electronic component comprises a capacitor including two metal plates and a dielectric layer separating the two metal plates, and the second moisture impenetrable shield includes a metal layer disposed between the at least partially moisture permeable material and the dielectric layer.

15. The semiconductor die of claim 13 wherein the second moisture impenetrable shield further includes a layer of substantially moisture impenetrable dielectric disposed between the at least partially moisture permeable material and the dielectric layer.

16. The semiconductor die of claim 15 wherein the substantially moisture impenetrable dielectric comprises silicon nitride.

17. The semiconductor die of claim 1 included in a radio frequency circuit module.

18. The semiconductor die of claim 17 included in a radio frequency device.

19. The semiconductor die of claim 1 wherein the moisture impermeable shield is disposed about at least two sides of the at least one electronic component.

20. The semiconductor die of claim 1 wherein the moisture impermeable shield is disposed between the at least one electronic component and one of the plurality of breaks in the die seal ring that is disposed closest to the at least one electronic component from among all of the plurality of breaks.

* * * * *